(12) United States Patent
Yu et al.

(10) Patent No.: US 7,719,499 B2
(45) Date of Patent: May 18, 2010

(54) ORGANIC ELECTRONIC DEVICE WITH MICROCAVITY STRUCTURE

(75) Inventors: Gang Yu, Santa Barbara, CA (US); Runguang Sun, Shanghai (CN)

(73) Assignee: E. I. du Pont de Nemours and Company, Wilmington, DE (US)

( * ) Notice: Subject to any disclaimer, the term of this patent is extended or adjusted under 35 U.S.C. 154(b) by 984 days.

(21) Appl. No.: 11/319,859

(22) Filed: Dec. 28, 2005

(65) Prior Publication Data

US 2007/0159086 A1  Jul. 12, 2007

(51) Int. Cl.
*G09G 3/32* (2006.01)
(52) U.S. Cl. .......................................... 345/83; 345/77
(58) Field of Classification Search ............. 345/44–46, 345/36, 76, 77, 80–83; 313/461, 463, 495–497, 313/504–506; 315/169.1, 169.3
See application file for complete search history.

(56) References Cited

U.S. PATENT DOCUMENTS

| | | | | |
|---|---|---|---|---|
| 5,952,776 A * | 9/1999 | Van Doorn et al. | .......... | 313/461 |
| 5,965,281 A | 10/1999 | Cao | | |
| 6,049,165 A * | 4/2000 | Spindt et al. | ................ | 313/495 |
| 6,756,732 B1 * | 6/2004 | Kawase | ....................... | 313/504 |
| 7,242,139 B2 * | 7/2007 | Hsu et al. | .................... | 313/497 |
| 2005/0140286 A1 * | 6/2005 | Ito et al. | ...................... | 313/506 |
| 2005/0264169 A1 * | 12/2005 | Lee | ............................. | 313/496 |
| 2006/0138945 A1 * | 6/2006 | Wolk et al. | .................. | 313/506 |

OTHER PUBLICATIONS

CRC Handbook of Chemistry and Physicas, 81st Edition, 2000 (Book Not Included).

* cited by examiner

*Primary Examiner*—Ricardo L Osorio
(74) *Attorney, Agent, or Firm*—John H. Lamming

(57) ABSTRACT

A multi-color pixel array and method includes an organic active layer of a material emitting a first spectral distribution of visible light having a first color; a transparent conducting layer, each of which include portions that correspond to individual pixels and sub-pixels of the array; one or more pairs of electrodes for selectively energizing sub-pixel areas of the organic active layer to generate an emission of visible light of a first spectral distribution; wherein different sub-pixels within individual pixels of the array have different optical thicknesses based at least on corresponding sub-pixel portions of the transparent conducting layer having different optical thicknesses; and wherein at least one sub-pixel of has a selected color different from the first color due to at least one narrowed spectral band being selected out of the first spectral distribution as emitted light is coupled out of the display through the transparent conducting layer.

20 Claims, 12 Drawing Sheets

ORGANIC ELECTRONIC DEVICE WITH MICROCAVITY STRUCTURE

FIELD OF THE DISCLOSURE

This invention relates in general to electronic devices, and more particularly, to organic electronic devices with a microcavity structure for full color displays.

BACKGROUND INFORMATION

Electronic devices, in particular, organic electronic devices such as light emitting devices are used in a variety of applications, including, for example, flat panel displays, due to their high efficiency, low operation voltage, high brightness and easy fabrication process. Although polymeric light emitting diodes (PLEDs) with different emitting colors have been demonstrated, integration of color pixels of three primary colors onto a single substrate presents challenges, particularly with regard to ink-jet printing techniques and microcavity structures.

Organic light emitting devices in microcavity structures include an active layer disposed between two optical mirrors. The emitting color can be varied not only by the choice of active material used, but also by tuning the optical length between the two mirrors. The cavity may be constructed on a glass or quartz substrate with a dielectric mirror. The dielectric mirrors are made of alternating layers of titanium oxide or silicon nitride of high refractive index media and silicon oxide of low refractive index media which are deposited by electron beam, sputtering or laser ablation.

There remains a need for a method and device that provides a full color display.

SUMMARY

The foregoing general description and the following detailed description are exemplary and explanatory only and are not restrictive of the invention, as defined in the appended claims.

In one embodiment, a multi-color display includes a pixel array. The pixel array includes: an organic active layer including a material that emits a first spectral distribution of visible light having a first color; a transparent conducting layer, wherein the organic active layer and the transparent conducting layer include portions that correspond to individual pixels and sub-pixels of the array; one or more pairs of electrodes for selectively energizing sub-pixel areas of the organic active layer to generate an emission of visible light of said first spectral distribution; and a substrate upon which said pixel array is formed, wherein different sub-pixels within individual pixels of the array have different optical thicknesses based at least on the corresponding sub-pixel portions of said transparent conducting layer having different optical thicknesses, and wherein at least one sub-pixel within an individual pixel of said array has a selected color different from said first color due to at least one narrowed spectral band being selected out of said first spectral distribution as said emitted light is coupled out of the display through the at least one sub-pixel including a sub-pixel portion of said transparent conducting layer having a predetermined finite optical thickness.

In another embodiment, a multi-color organic LED display includes a pixel array. The pixel array includes: a substrate; an organic active layer and a transparent conducting layer formed on the substrate: the organic active layer comprising a material that emits a first spectral distribution of visible light of a first color; the transparent conducting layer and the active layer including portions corresponding to pixels and sub-pixels of said array; (c) one or more pairs of electrodes for selectively energizing sub-pixel areas of the organic active layer to generate an emission of visible light of a first spectral distribution, wherein different sub-pixels within individual pixels of said array have different optical thicknesses based at least on corresponding sub-pixel portions of said transparent conducting layer having different optical thicknesses, and wherein interface reflectivities are present wherein at least one narrowed spectral band is selected within said first spectral distribution by outcoupling emitted light through at least one corresponding sub-pixel area of said transparent conducting layer having a predetermined finite optical thickness.

BRIEF DESCRIPTION OF THE DRAWINGS

The invention is illustrated by way of example and not limitation in the accompanying figures.

Figure 1A:
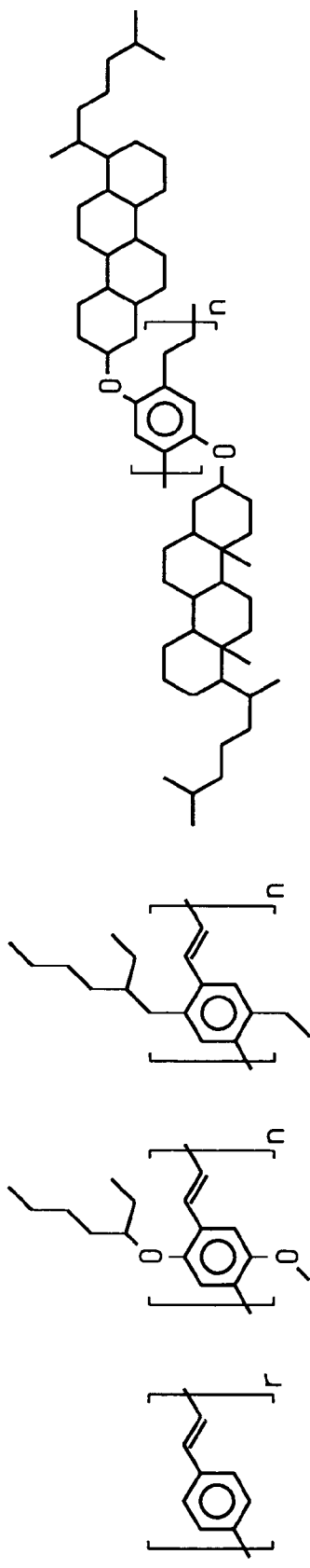
FIGS. 1a-1b illustrate examples of chemical structures of two main classes of polymer-based light emitting materials, namely PPV- and polyfluorene-based polymer materials.

It is to be appreciated that, certain features of the invention which are, for clarity, described above and below in the context of separate embodiments, may also be provided in combination in a single embodiment. Conversely, various features of the invention that are, for brevity, described in the context of a single embodiment, may also be provided separately or in any subcombination. Further, reference to values stated in ranges includes each and every value within that range. It is to be understood that the elements in the figures are not necessarily drawn to scale. For example, the dimensions of some of the elements in the figures may be exaggerated relative to other elements to assist in an understanding of the embodiments of the invention.

DETAILED DESCRIPTION

Other features and advantages of the invention will be apparent from the following detailed description, and from the claims.

In one embodiment, a multi-color display includes a pixel array. The pixel array includes: an organic active layer including a material that emits a first spectral distribution of visible light having a first color; a transparent conducting layer, wherein the organic active layer and the transparent conducting layer includes portions that correspond to individual pixels and sub-pixels of the array; one or more pairs of electrodes for selectively energizing sub-pixel areas of the organic active layer to generate an emission of visible light of said first spectral distribution; and a substrate upon which said pixel array is formed, wherein different sub-pixels within individual pixels of the array have different optical thicknesses based at least on the corresponding sub-pixel portions of said transparent conducting layer having different optical thicknesses, and wherein at least one sub-pixel within an individual pixel of said array has a selected color different from said first color due to at least one narrowed spectral band being selected out of said first spectral distribution as said emitted light is coupled out of the display through the at least one sub-pixel including a sub-pixel portion of said transparent conducting layer having a predetermined finite optical thickness. The outcoupling through the sub-pixels of the transparent conducting layer includes selecting at least one narrowed spectral band having a bandwidth that provides a finesse of approximately 10 or less. An injection current of 100 Amps/cm$^2$ or more provides a brightness of 106 cd/m$^2$ or more. The pixels comprise a quarter VGA format pixel density. The substrate includes a Distributed Bragg Reflector (DBR). The Distributed Bragg Reflector (DBR) includes glass or plastic and has a reflectivity of less than approximately 90%. At least one of the pair of electrodes includes an at least semi-transparent metallic layer including gold or silver or a combination thereof. The at least one of said pair of electrodes further includes an at least semitransparent second metallic layer of chromium, tantalum or molybdenum or a combination thereof. The surface resistance of at least one of said pair of electrodes is approximately one ohm/cm$^2$ or less. The at least one of the pair of electrodes comprises a compound metal bi-layer. The organic active layer comprises a conjugated polymer, a polymer blend, a small molecule compound, an organometallic compound, or a combination thereof. The transparent conducting layer comprises a polymer.

In another embodiment, a multi-color organic LED display includes a pixel array. The pixel array includes: a substrate; an organic active layer and a transparent conducting layer formed on the substrate: the organic active layer comprising a material that emits a first spectral distribution of visible light of a first color; the transparent conducting layer and the active layer including portions corresponding to pixels and sub-pixels of said array; (c) one or more pairs of electrodes for selectively energizing sub-pixel areas of the organic active layer to generate an emission of visible light of a first spectral distribution, wherein different sub-pixels within individual pixels of said array have different optical thicknesses based at least on corresponding sub-pixel portions of said transparent conducting layer having different optical thicknesses, and wherein interface reflectivities are present wherein at least one narrowed spectral band is selected within said first spectral distribution by outcoupling emitted light through at least one corresponding sub-pixel area of said transparent conducting layer having a predetermined finite optical thickness. The substrate comprises a Distributed Bragg Reflector (DBR). The Distributed Bragg Reflector (DBR) comprises glass or plastic and having a reflectivity less than approximately 90%. The transparent conducting layer comprises polyaniline, polythiophene, or polypyrrole, or combinations thereof. The active layer comprises a substantially uniform thickness over the multiple sub-pixel areas within the pixels of the array. The uniform thickness is in a range approximately between 50 nm and 100 nm. The first spectral distribution comprises an approximately 250 nm to 300 nm width. The organic active layer comprises a conjugated polymer, a polymer blend, a small molecule compound, an organometallic compound, or a combination thereof.

Definitions

Before addressing the embodiments described below, various terms are herein defined.

As used herein, the terms "organic electronic device" is intended to mean a device including one or more organic semiconductor layers or materials. An organic electronic device includes, but is not limited to: (1) a device that converts electrical energy into radiation (e.g., a light-emitting diode, light emitting diode display, diode laser, or lighting panel), (2) a device that detects a signal using an electronics process (e.g., a photodetector, a photoconductive cell, a photoresistor, a photoswitch, a phototransistor, a phototube, an infrared ("IR") detector, or a biosensor), (3) a device that converts radiation into electrical energy (e.g., a photovoltaic device or solar cell), (4) a device that includes one or more electronic components that include one or more organic semiconductor layers (e.g., a transistor or diode), or any combination of devices in items (1) through (4).

The term "layer" is used interchangeably with the term "film" and refers to a coating covering a desired area. The term is not limited by size. The area can be as large as the entire device or as small as a specific functional area such as the actual visual display, or as small as a single sub-pixel. Layers and films can be formed by any conventional deposition technique, including vapor deposition and liquid deposition (continuous and discontinuous techniques) and thermal transfer. Continuous deposition techniques, include but are not limited to spin coating, gravure coating, curtain coating, dip coating, slot-die coating, spray coating, and continuous nozzle coating. Discontinuous deposition techniques include, but are not limited to ink jet printing, gravure printing, and screen printing.

The term "active" when referring to a layer or material is intended to mean a layer or material that exhibits electronic or electro-radiative properties. An organic layer, including an active material, may emit radiation or exhibit a change in concentration of electron-hole pairs when receiving radiation.

The term "active material" refers to a material which electronically facilitates the operation of a device. Examples of active organic materials include, but are not limited to materials that conduct, inject, transport, or block a charge, and may emit radiation, where the charge can be either an electron or a hole. Examples of active organic materials also include materials that emit light upon the application of a charge and may be small molecules, organo-metallic compounds, semi-conducting compounds, or polymers. Examples of inactive materials include, but are not limited to planarization materials, insulating materials, and environmental barrier materials.

The term "adjacent" does not necessarily mean that a layer, member or structure is immediately next to another layer, member or structure. A combination of layer(s), member(s), or structure(s) that directly contact each other are still adjacent each other.

The term "MOCVD" means metallo-organic chemical vapor deposition.

The term "PECVD" means plasma-enhanced chemical vapor deposition.

The term "pixel" is intended to mean the smallest complete, repeating unit of an array. The term "subpixel" is intended to mean a portion of a pixel that makes up only a part, but not all, of a pixel. In a full-color display, a full-color pixel can comprise three sub-pixels with primary colors in red, green and blue spectral regions. A monochromatic display may include pixels but no subpixels. A sensor array can include pixels that may or may not include subpixels.

The term "radiation-emitting component" is intended to mean an electronic component, which when properly biased, emits radiation at a targeted wavelength or spectrum of wavelengths. The radiation may be within the visible-light spectrum or outside the visible-light spectrum (ultraviolet ("UV") or infrared ("IR")). A light-emitting diode is an example of a radiation-emitting component.

The term "radiation-sensing component" is intended to mean an electronic component, which can sense radiation at a targeted wavelength or spectrum of wavelengths. The radiation may be within the visible-light spectrum or outside the visible-light spectrum (UV or IR). An IR sensor is an example of a radiation-sensing component.

The term "charge transport" when referring to a layer, material, member, or structure is intended to mean such layer, material, member or structure that facilitates migration of such charge through the thickness of such layer, material, member or structure with relative efficiency and small loss of charge.

The term "electron transport means, when referring to a layer, material, member or structure, such a layer, material, member or structure that facilitates migration of negative charge through the thickness of such layer, material, member or structure with relative efficiency and small loss of charge.

The term "hole transport" means, when referring to a layer, material, member or structure, such a layer, material, member or structure that facilitates migration of positive charges through the thickness of such layer, material, member or structure with relative efficiency and small loss of charge.

The term "small molecule," when referring to a compound, is intended to mean a compound which does not have repeating monomeric units. In one embodiment, a small molecule has a molecular weight no greater than approximately 2000 g/mol.

The term "polymer" is intended to mean a material having at least one repeating monomeric unit. The term includes homopolymers having only one kind of monomeric unit, and copolymers having two or more different monomeric units. Copolymers are a subset of polymers. In one embodiment, a polymer has at least 5 repeating units.

The term "continuous" and its variants are intended to mean substantially unbroken. In one embodiment, continuously printing is printing using a substantially unbroken stream of a liquid or a liquid composition, as opposed to a depositing technique using drops. In another embodiment, extending continuously refers to a length of a layer, member, or structure in which no significant breaks in the layer, member, or structure lie along its length.

The term "coupled" is intended to mean a connection, linking, or association of two or more electronic components, circuits, systems, or any combination of: (1) at least one electronic component, (2) at least one circuit, or (3) at least one system in such a way that a signal (e.g., current, voltage, or optical signal) may be transferred from one to another. A non-limiting example of "coupled" can include a direct connection between electronic component(s), circuit(s) or electronic component(s) or circuit(s) with switch(es) (e.g., transistor(s)) connected between them.

The term "substantially" is intended to mean largely but not necessarily wholly that which is specified.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present). The term "on" as in A "on" B shall mean, either directly "on", i.e., A in physical contact with B, or A is indirectly in contact with B, through another material or layer.

The terms "a" or "an" as used herein are to describe elements and components of the invention. This is done merely for convenience and to give a general sense of the invention. This description should be read to include one or at least one and the singular also includes the plural unless it is obvious that it is meant otherwise.

Group numbers corresponding to columns within the periodic table of the elements use the "New Notation" convention as seen in the CRC Handbook of Chemistry and Physics, $81^{st}$ Edition (2000).

To the extent not described herein, many details regarding specific materials, processing acts, and circuits are conventional and may be found in textbooks and other sources within the organic light-emitting display, photodetector, semiconductor and microelectronic circuit arts.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

Organic Electronic Device

Figure 1B:
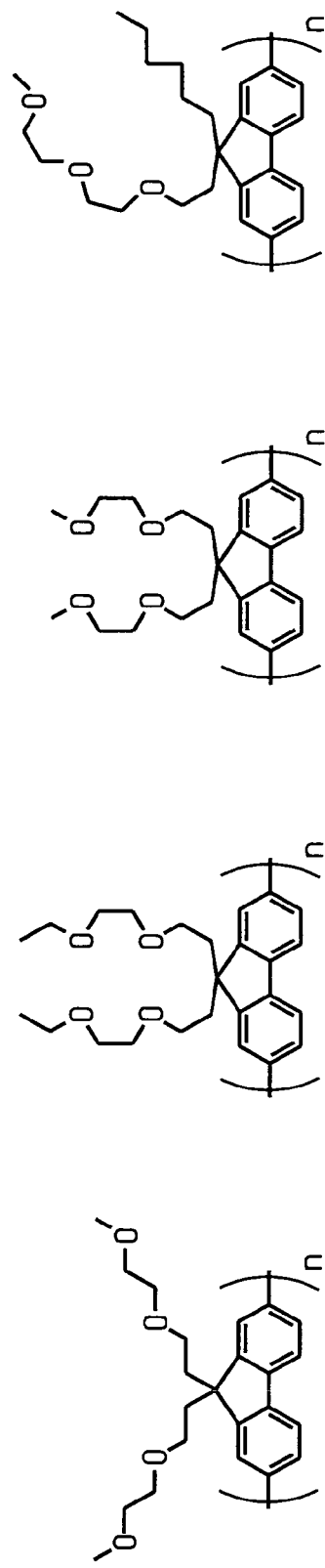

Referring now to the drawings, FIGS. 1A-1B illustrate examples of chemical structures of two classes of polymer-based light emitting materials, namely PPV- and polyfluorene-based polymer materials. These exemplary chemical structures and those of other organic and/or polymer materials may be used as active material layers in LED displays as understood by those skilled in the art.

Figure 2A:
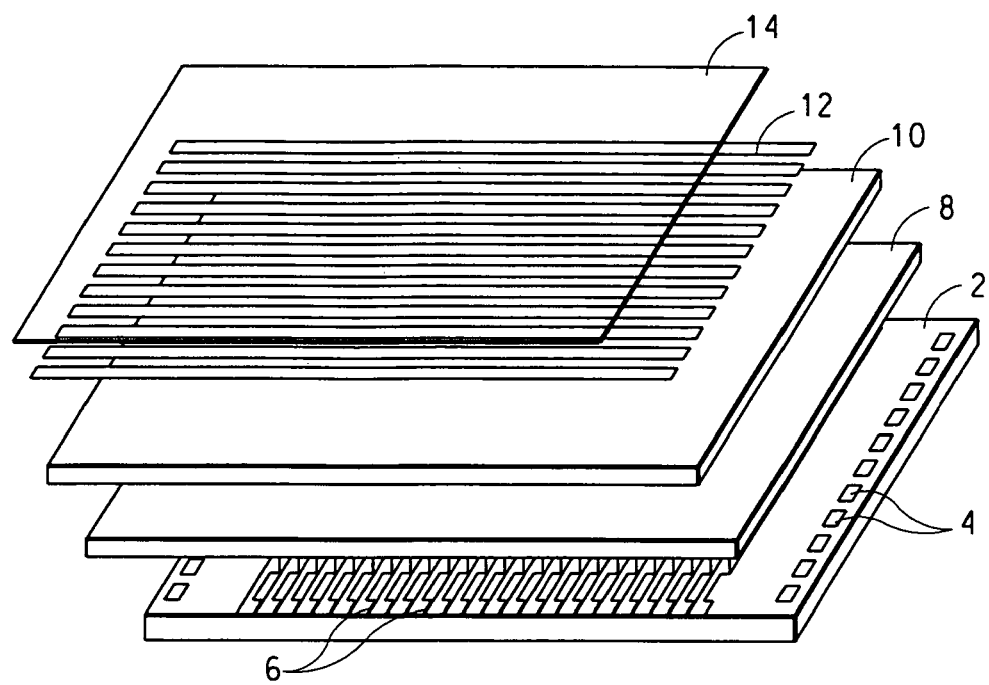
FIG. 2a illustrates schematically a general passive matrix display structure for an organic polymer-based LED display.
Figure 2B:
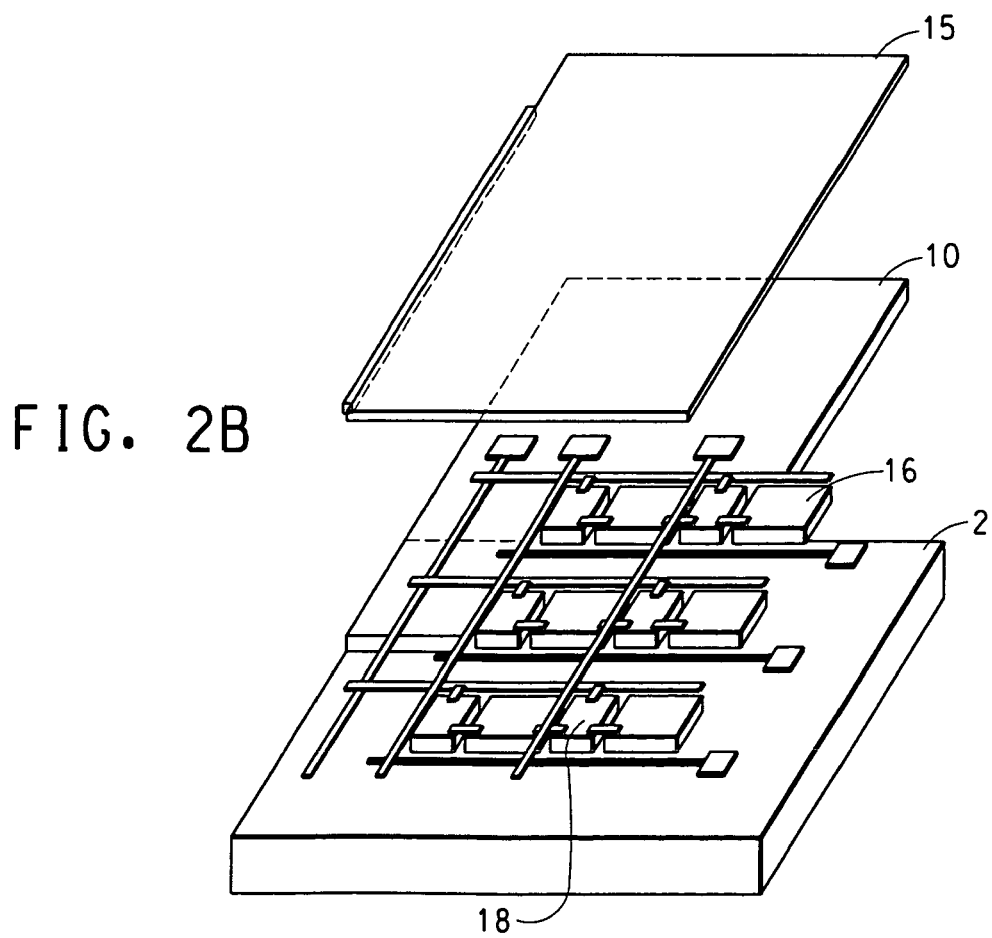
FIG. 2b illustrates schematically a general active matrix display structure for an organic polymer-based LED display.

FIG. 2A illustrates schematically a general passive matrix display structure for an organic and/or polymer-based LED display. The substrate 2 illustrated in FIG. 2A has contact pads 4 and ITO lines 6 formed thereon. A buffer layer 8 is disposed between the substrate 2 and an active polymer and/ or organic light emitting layer 10. Cathode electrode lines 12 are also illustrated, although the electrodes 12 may be cathodic or anodic depending on the particular design parameters of the display. A layer 14 protects the polymer and/or organic material from being corroded by any oxygen and moisture present in the ambient air. In FIG. 2A, the light emission is toward and through the glass substrate 2 which is at least substantially transparent to the visible wavelengths emitted by the active layer 10. FIG. 2B illustrates schematically a general active matrix display structure for a small molecule and/or polymer-based organic LED display. The substrate 2 in FIG. 2B has transparent electrodes 16 formed thereon. A buffer layer (similar to layer 8 in FIG. 2a) may be present, but is not illustrated in FIG. 2b. An active polymer and/or molecular organic light emitting layer 10 is present in the display structure. A top electrode 15 is also disposed on the light emitting layer 10, which is positioned between the electrodes 15 and 16. Electrodes 15 and 16 may each be cathodic or anodic depending on the particular design parameters of the display. Pixels drivers 18 are also illustrated in FIG. 2b. A layer as illustrated in FIG. 2a may be disposed on the top electrode 15 to protect the polymer and/or organic material from being corroded by oxygen and moisture present. In FIG. 2b, the light emission is toward and through the glass substrate 2 which is at least substantially transparent to the visible wavelengths emitted by the active layer 10.

Figure 3A:
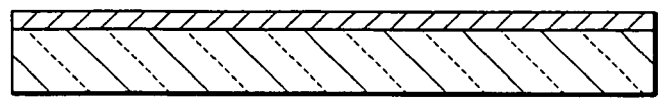
FIGS. 3a-3i illustrate multiple process steps that may be taken to form a polymer-based LED display.
Figure 3B:
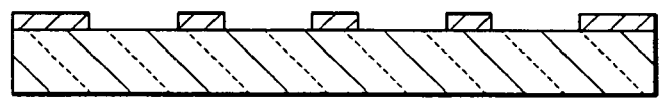
Figure 3C:
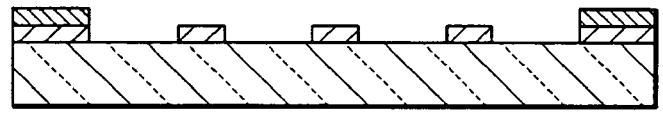

Each of the passive matrix and active matrix configurations include opposing electrodes for selectively energizing pixels and sub-pixels of the display at determined times. As referred to herein, the "pixels" are the basic units of the composition of an image on the display. The pixels may be sub-divided, however, into sub-pixels that emit different colors. At least one electrode is formed of an at least partially transparent material such as indium-tin-oxide (ITO) or a partially transparent metallic layer or other at partially transparent conducting contact material. The other electrode may be formed of an opaque metal or also a partially transparent metal or ITO or other conducting contact material. Note that the polymer layer 10 of FIGS. 2a-2b may be alternatively a small molecule organic light emitting layer. FIGS. 3a-3i illustrate multiple process steps that may be taken to form a polymer-based LED display. The exemplary process begins with a glass substrate having a layer of ITO thereon as illustrated at FIG. 3a. The ITO is structured as shown in FIG. 3b preferably using photolithographic techniques. Metal pads may then be applied using sputtering and/or photolithography as illustrated at FIG. 3c.

Figure 3D:
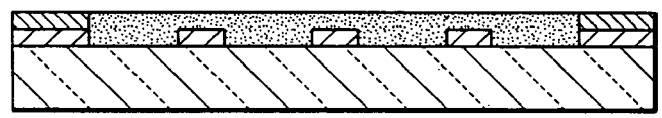
Figure 4A:
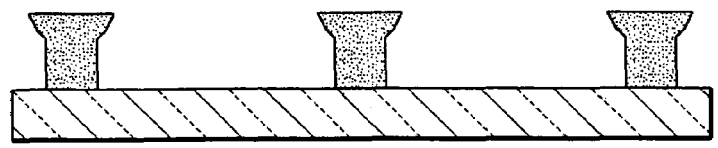
FIGS. 4a-4b illustrate schematically a mushroom photoresist structuring for facilitating a multiple pixel array structure of a polymer-based LED display.
Figure 4B:
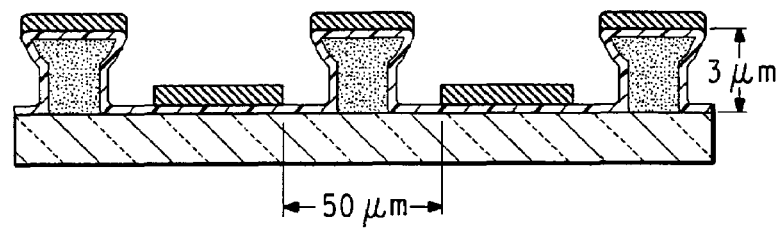

At this point, FIG. 3d illustrates the application of mushrooms formed of a photoresist. The mushroom structures assist in providing a template for forming a pixelized array structure. FIGS. 4a-4b illustrate the mushroom structures comprising photoresist ridges formed. When an active polymer layer is applied onto the mushroom structures illustrated at FIG. 4a, the active polymer layer is separated by the ridges as illustrated in FIG. 4b. Using this structure, electrical energy may be separately applied to individual pixels of the array.

The mushroom structure illustrated FIGS. 4a-4b may also be used in a monochrome display, for a selected color, where the photoresist ridges may be spaced more closely depending upon the color display with prescribed resolution. The photoresist ridges function as a dam, forming channels and preventing the first polymer disposed adjacent the substrate from contacting a second polymer disposed adjacent the first existing polymer layer.

Figure 3E:
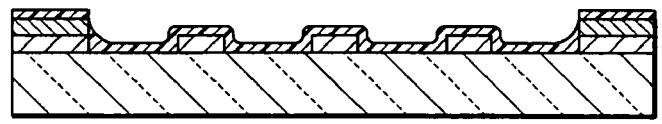
Figure 3F:
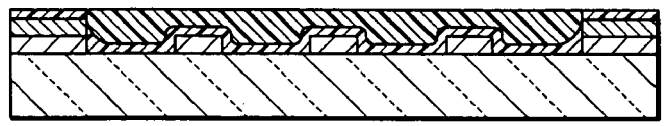
Figure 3G:
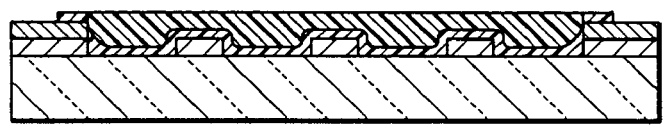
Figure 3H:
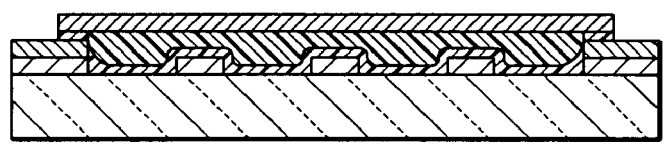
Figure 3I:
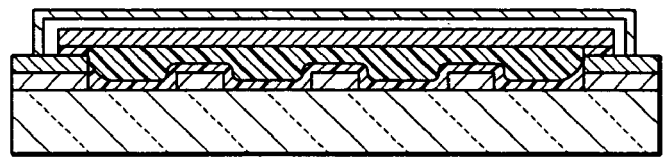

Referring to FIGS. 3e-3f, a PANi or PEDT layer and polymer and/or organic layer are deposited. In FIG. 3g, laser ablation may be used to structure the polymer and PANi.

The low-Q microcavity PLEDs (MCPLEDs) for colored display applications disclosed herein are of high color purity, high device efficiency and high light emission intensity. By introducing a resistive polymer layer to adjust the emission color, color pixels of three primary colors (RGB) can be achieved with a continuous polymer (or small molecule) layer with homogeneous thickness. This approach allows full-color emissive display to be made with a process similar to that used for monocolor displays, which has the advantages of high manufacturing yield, simplified processes, and low fabrication cost.

Figure 5:
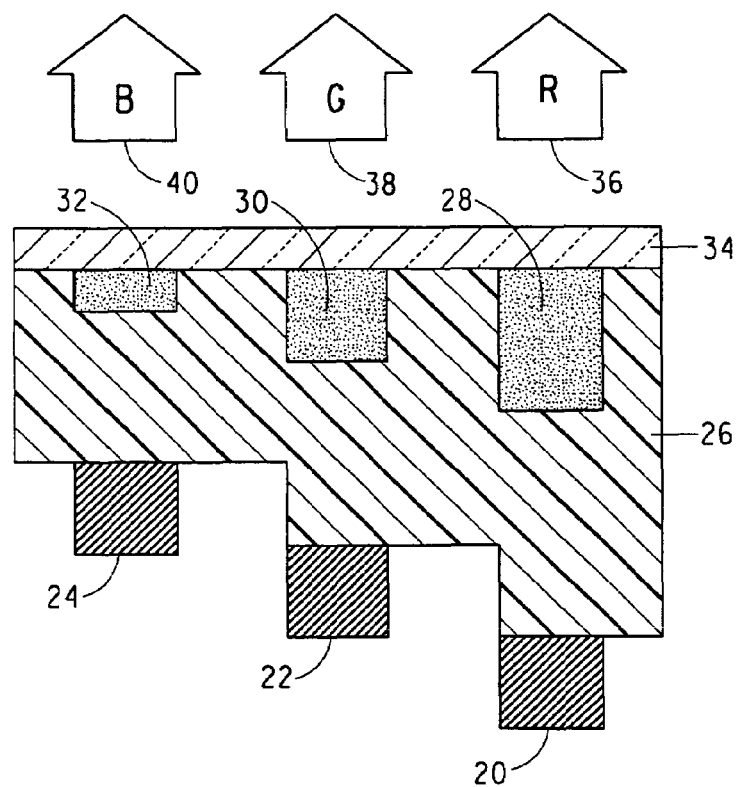
FIG. 5 schematically illustrates an exemplary structure of a microcavity light emitting device in accordance with an embodiment.

Microcavity organic light emitting diodes include a substrate, anode, conducting polymer layer, emitting (molecular or polymeric) layer and cathode. The device structure is illustrated in FIG. 5. The device structure includes mirror electrodes 20, 22 and 24 for each of three colors of the RGB pixel structure. Red, green and blue colors are ideal, however, a color display may be created using three colors from red to green. A color display may include only two colors. The electroluminescent polymer and/or organic material 26 is illustrated with all three sub-pixels or portions of the color pixel shown in FIG. 5.

A PPV polymer emits characteristically from green to red, but has very little blue in its electroluminescence output. There are many options for obtaining the blue sub-pixels, i.e., along with the red and green/yellow sub-pixels. First, a separate blue polymer and/or organic material may be used to create the blue sub-pixels, e.g., by using laser ablation to remove the PPV from the blue sub-pixel locations and applying the blue EL emitting material either over the entirety of the PPV layer such as by non-selective coating, e.g. using spin-coating, or over just the removed portions such as by ink-jet printing. Second, a polymer and/or organic material blend may be used, wherein PPV and a blue emitting material are mixed together in selected proportions and spin-coated over the entirety of each of the pixels of the array without removing the sub-pixel portions to provide for a second blue emitting material to be later applied. Although the blended material would emit all of the colors at all of the sub-pixel locations of the pixels, the wavelength selection feature allows for the selection of the desired wavelengths for each of the sub-pixels based on the distance between the reflecting electrodes 20, 22, 24, and 34, e.g., due to the variance of the buffer and/or hole injection layer 28 or by other means. In general, the EL polymer and/or organic material layer 26 may include one or more conjugated polymers, an EL polymer blend, organic EL molecules, or organometallic compounds, or combinations thereof, and/or as described in more detail below.

In FIG. 5, the different colors for the sub-pixels are selected by wavelength selective output coupling based on the spacing of the mirrors 20, 22, and 24 from mirror 34. This spacing is determined in the example of FIG. 5 by the lengths of the PANi 26 or other hole injection material layers 28, 30, and 32. Using interference effects, only a band of wavelengths are selected based on the optical path length between the mirrors and particularly based on the optical path lengths of the buffer layers 28, 30 and 32. The result is red emission 36 from the red sub-pixels, green/yellow emission 38 from the green/yellow sub-pixels, and blue emission 40 from the blue sub-pixels.

The optical path lengths for each of the sub-pixels may be controlled by controlling the geometric length and/or the indices of the refraction across which the light will travel.

Other ways to space the reflective electrodes may be understood by those skilled in the art.

The substrate can be made of glass or plastic film and can be coated with inorganic compound layers (such as $TiO_2$, $Si_xNy$, $SiO_2$ and so on) or polymer layers of different refractive indexes. Such organic or inorganic coating layers in alternating structures form generally a Diffraction Bragg Reflector (DBR) device with special optical characteristics at a selected optical band. In one embodiment, the anode is semitransparent or transparent so that part of the emitting light can pass through the anode and the substrate.

The anode layer may be prepared by vacuum deposition, chemical plating or other coating techniques known in the art. The anode can also be made with semiconductor materials such as ITO (indium-tin oxide); $TiO_2$, SiC, GaN, ZnO, CdSe, CdS and so on, layers of which are semiconducting and transparent in the visible range. These materials may be deposited by PECVD, MOCVD, thermal evaporation, sol-gel method and other techniques known in the art.

The next layer deposited is a conducting polymer layer which can be selected from doped polyaniline, polythiophene, polypyrrole and so on. It may be prepared by spin-coating, dip-coating, ink-jet printing, thermal transfer printing, screening printing, stamping and other coating techniques known to the art. Lithography and the printing techniques listed above allow this layer be patterned into a predefined area.

The thickness of the conducting layers can be controlled by spin speed and lithography and printing technology. The emitting layer is made of luminescent organic materials. Examples include conjugated polymers (such as PPV, PF, PT, PQ, PPP and their derivatives), NPD, $Alq_3$ and other EL molecules, organometallic compounds (such as Ir, Eu, La contained complexes) and their combinations in blend or multilayer forms.

The emission layer can be prepared by spin-coating, dip-coating, ink-jet printing and other printing techniques known in the art, or by thermal evaporation or other evaporation techniques known in the art. The cathode having a suitable work function to provide necessary electron injection, can be made with a metal multiple metal elements in multiple layer form or in alloy form. The cathode can also be made in compound/metal bi-layer form. Suitable metals used for the cathode include calcium, barium, lithium, magnesium, aluminum and silver. The anode can be made with a metal material such as gold, and silver, for example. Compounds used in the bilayer cathode include LiF, BaO, $Li_2O$, CsO. A series of organic anionic surfactant compounds suitable for the bilayer cathode are disclosed by Yong Cao in U.S. Pat. No. 5,965,281, the disclosure of which is hereby incorporated by reference.

The emission spectra of most polymers and fluorescent dyes are broad and the color purity does not meet the need for color display applications. A microcavity has the effect of narrowing the spectra and improving the color purity. Moreover, a microcavity allows the tuning of the peak emitting wavelength of the LED with device geometric parameters.

In a microcavity device, the emission peak wavelength $\lambda_{max}$ is, according to the following formula:

$$2(n_1 d_1 + n_2 d_2)\cos(\theta) + \phi = m\lambda_{max} \quad (m=1,2) \quad (1),$$

where $n_1 d_1$ and $n_2 d_2$ are the refractive index and thickness of the conducting layer and emitting material respectively, $\theta$ is the observation angle; $\phi$ is the total phase change of the light reflected by a metal mirror. The $\lambda_{max}$ has been tuned by varying the thickness of the emitting material, but the device operation parameters tend to vary considerably using this technique. It has now been found that the $\lambda_{max}$ can be adjusted by introducing a transparent conducting polymer layer, with a thickness meeting the conditions shown in Eq. 1.

Due to the transmittance and reflectivity of the metal mirrors, the output spectrum $F(\lambda)$ of a cavity light emitting device is:

$$F(\lambda) = f(\lambda) Q[R(\lambda), d, \theta] \quad (2),$$

where $f(\lambda)$ is the free space EL spectrum; Q is the transfer function of the optical cavity (also called optical etalon) which is depending on $R(\lambda)$ (the reflectivity of mirrors), d and $\theta$. From (1) and (2), the emitting spectrum of a microcavity light emitting device is dependent on the intrinsic fluorescent property of material, the transmittance-reflectivity of anode mirror, the optical length of the cavity (summation of refraction index times geometric thickness of each layer of the organic stack between the two mirror) and the observing angle.

Outcoupling through at least one sub-pixel area may serve to select the at least one narrowed spectral band having a bandwidth that provides a finesse of approximately 10 or less.

The finesse is defined as the center peak wavelength divided by the width of the emission profile. It has now been found that microcavity devices with relatively low finesse (Q value) can be used for color pixels, for example, in flat-panel display applications. When a semitransparent metal (such as Au or Ag) is chosen as the anode material, the metal electrodes serve both optical mirror and electric connection. Such cavity devices can be driven to brightness higher than millions of cd/m$^2$ with injection current measured at more than $10^2$ A/cm$^2$, thus allowing for high pixel density full-color displays in a passive matrix format.

EXAMPLES

The following examples are meant to illustrate and not limit the scope of the invention.

Example 1

Microcavity PLEDS with Color Purity Meeting CIE Specification

Figure 6A:
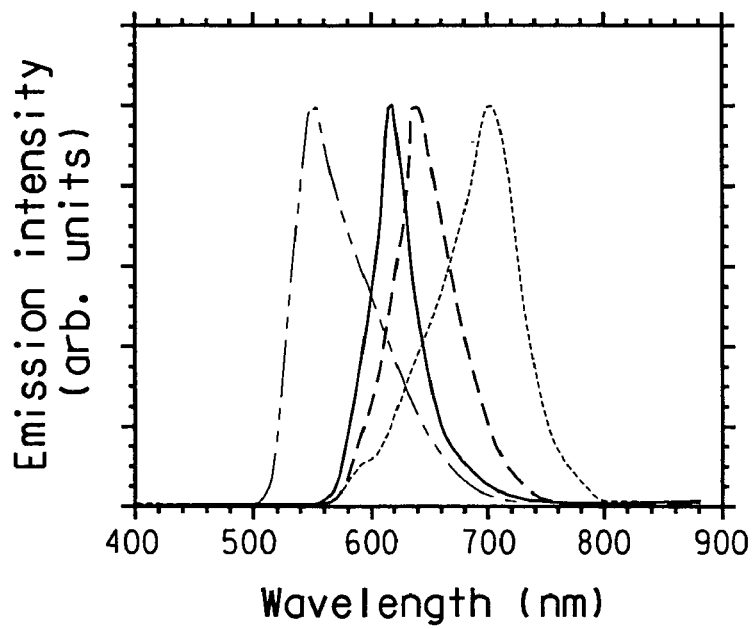
FIGS. 6a-6b illustrate respectively emission spectra and their CIE color coordinates of a series of microcavity PLEDs in accordance with another embodiment in comparison with color pixels of commercial HDTV.
Figure 6B:
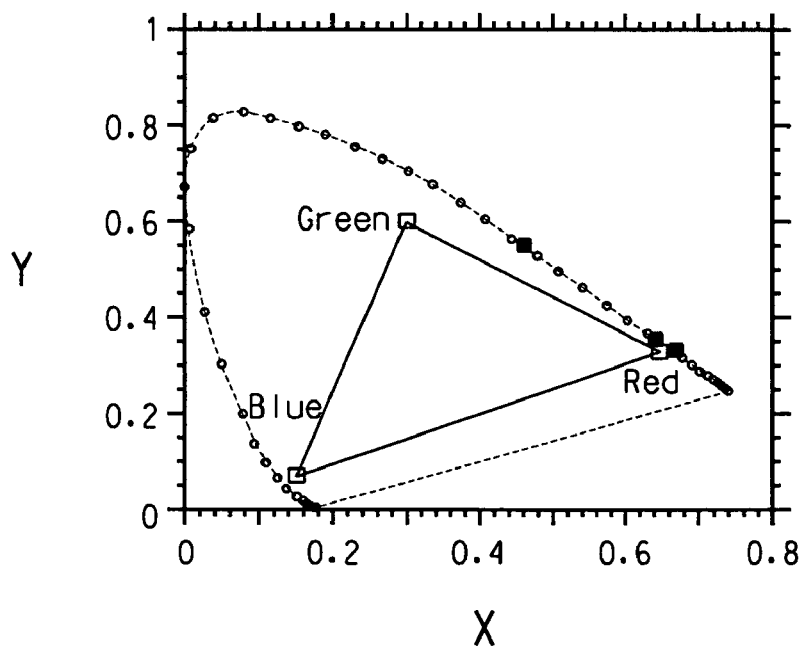

Microcavity devices were fabricated according to the following process. Glass was used as the substrate material. A Cr/Au material was used as the anode contacts which were prepared by thermal evaporation with thicknesses of 5 nm and 15 nm, respectively. A thin, transparent PANI layer was then spin-cast with a thickness varying in a range of 30 nm-500 nm in this example. A PPV derivative, with an EL emission covering 500-800 nm range, was used as the active layer, having a thickness of about 70 nm. A Ba(5 nm)/Al(300 nm) material was used as the cathode layer. EL emission with greenish-yellow, orange and red color was observed. The I-V and L-V characteristics follow the same trend, which is satisfactory for use in color-displays with standardized drivers. The respective emission spectra and CIE color coordinates are illustrated in FIGS. 6a-6b.

This example demonstrates that the peak emission and color coordinates can be varied by adjusting the transparent conducting polymer layer. PLED can be made with color purity comparable to that used for color TV monitors. Advantageously, by keeping the parameter of the EL polymer layer fixed, the device electric parameters can be standardized that such color pixels can be driven with identical drivers.

Figure 7:
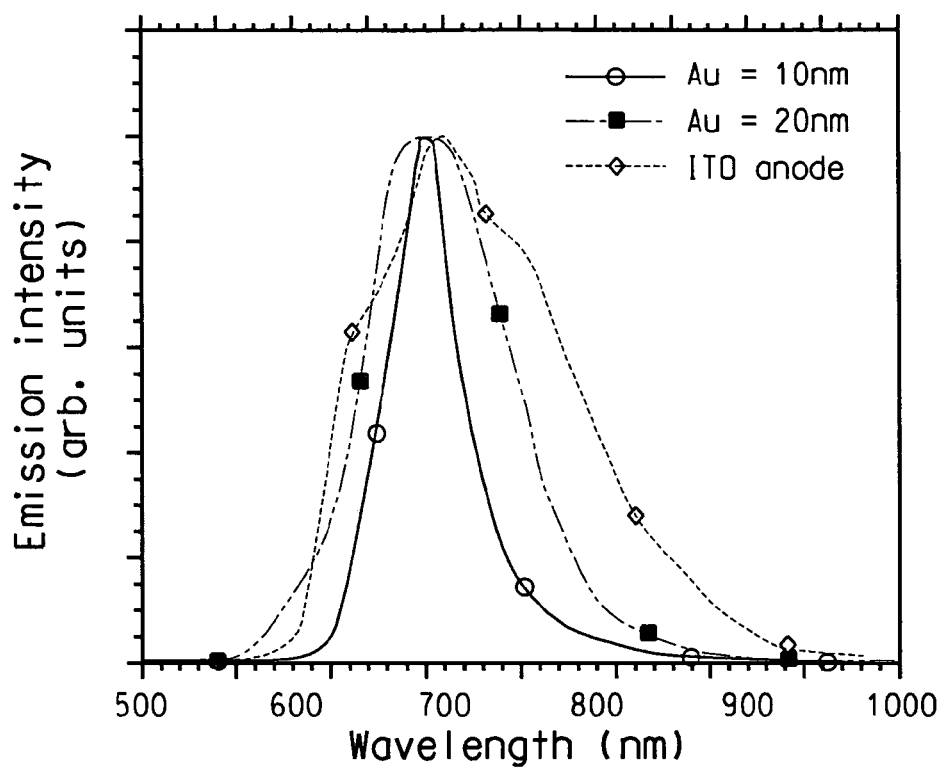
FIG. 7 illustrates emission profiles of two microcavity devices in accordance with another embodiment compared with a non-cavity device.

Microcavity devices may also be fabricated following a similar procedure described in Example 1. Glass was used as the substrate material. A Cr/Au material was used as the anode contact and was prepared by thermal evaporation. The reflectivity (and transmittance) of the anode was adjusted by varying the Au thickness. A thin, transparent PANI layer was then spin-cast with varied thicknesses in the range of 300-1000 Å. A PPV derivative with EL emission covering a 550-800 nm range was used as the active layer, having a thickness of about 70 nm. Ca(5 nm)/Al(300 nm) was used as the cathode layer. FIG. 7 illustrates the emission profiles of two microcavity devices with an Au thickness of 10 nm and 20 nm, respectively. Different spectral widths were observed. For comparison, an emission profile of an EL material in a device with an ITO anode is also provided in FIG. 7. The data show that a microcavity device structure can be used to narrow the emission profile to meet the color purity requirement for full-color displays.

This example demonstrates that the emission spectral width can be manipulated by the reflectivity of the mirror layer. It also demonstrates that the central wavelength of the emission profile is determined by the optical length (the thicknesses of the polymer layers) of the microcavity.

Example 2

Microdevices with Red, Green and Blue Color Pixels with High Color Purity

Microcavity devices were fabricated following similar procedures to those in Example 1. Several polymers with broad emission profiles in the visible region were used as the active layer. The thickness of the active layer was kept at 70 nm. The optical length of the microcavity was varied by the thickness of a thin, transparent PANI layer. Cr/Au was used as the anode material with thicknesses of 5 nm and 150 nm, respectively. With such parameters, the reflection of the Au surface was about 50%-70%, and the finesse of the optical etalon formed by cathode and anode was about 5-10.

Figure 8A:
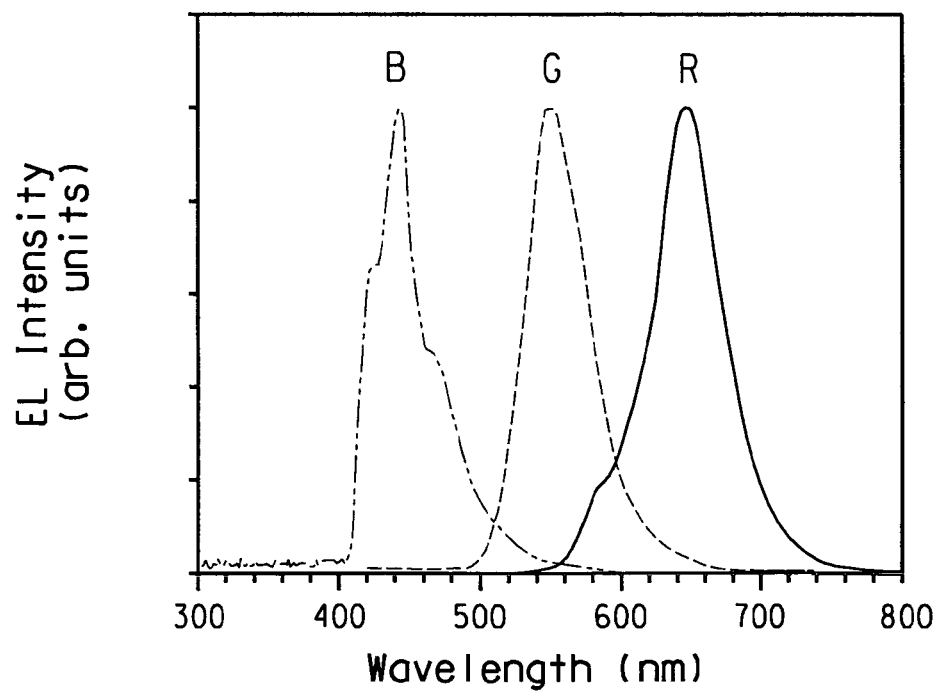
FIGS. 8a-8b illustrate emission spectra of three microcavity PLEDs and the corresponding CIE color coordinates in accordance with an embodiment, with a comparison with color pixels of commercial HDTV.
Figure 8B:
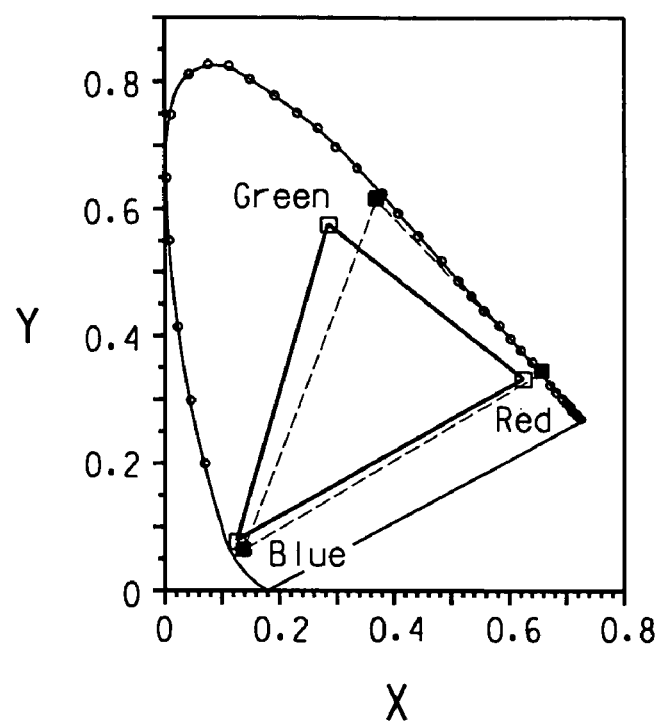

FIGS. 8a-8b illustrate the emission spectra and the corresponding CIE color coordinates of three microcavity devices. At the center of the wavelength of 450 nm, 530 nm and 630 nm, the corresponding spectral width of the optical etalon is about 50 nm. The emission peaks, spectral width and color coordinates are significantly improved comparing to PLEDs made without a microcavity structure. In fact, these parameters are close to or even better than that required by CIE for HDTV (as illustrated in the data set from color pixels of a commercial TV set provided for comparison). This example demonstrates that the peak emission and color coordinates can be varied by adjusting the transparent conducting polymer layer. Advantageously, red, green and blue PLEDs can be made with color purity and color coordinates meeting that required by CIE, and full color displays can be made with microcavity PLED pixels.

Example 3

High Brightness PLEDS Made with Microcavity Devices

Microcavity PLEDs were fabricated with a structure of Cr/Au/PANI/MEH-PPV/Ca. Their performance was compared with that of devices made using ITO anodes. The external EL efficiency was 2.3% ph/el, comparable to that of the reference ITO devices (between 2 to 2.5% ph/el). Moreover, the high quantum efficiency persists over a broad current range extending to over 5 A/cm² (with luminance over 500,000 cd/m²) which is better than that achieved with metal-oxide transparent electrodes.

Figure 9:
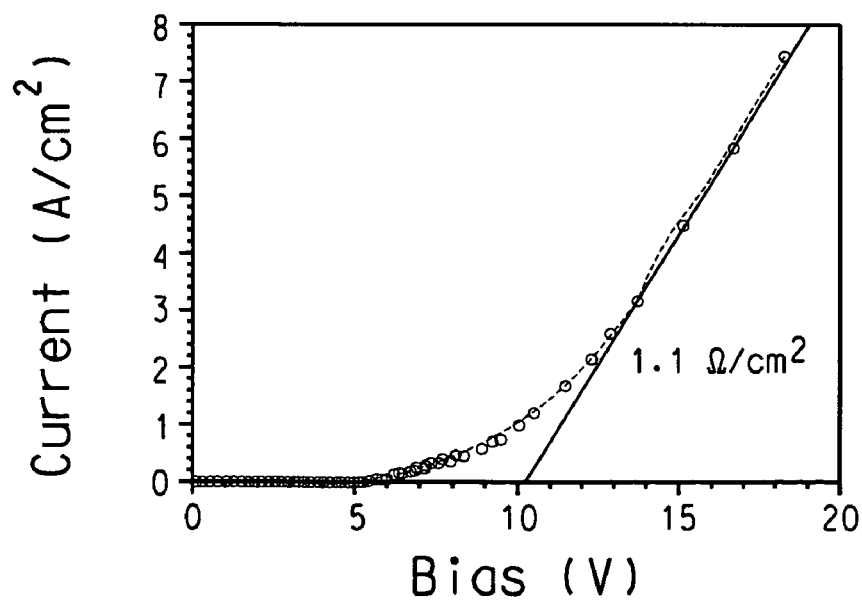
FIG. 9 illustrates I-V characteristics of a Cr/Au microcavity PLED in accordance with an embodiment.

An additional advantage of metal devices over ITO devices is revealed when they were driven by high voltage pulse trains, simulating the driving scheme for a passively addressed dot matrix display. For current densities higher than a few hundreds of mA/cm², the driving voltage is much lower for Cr/Au devices than that of the reference ITO devices. The I-V characteristic of a Cr/Au device under pulsed operation is illustrated in FIG. 9. The dynamic resistance of the microcavity LED can be inferred from the slope. The value is about 1.1 W/cm². Since the contact resistance of the Cr/Au electrode is only a fraction of the tested dynamic resistance, the results in FIGS. 8a-8b indicate that a surface resistance lower than 1 W/cm² was achieved (more the ten times better than that in devices made with ITO anode. This low surface resistance allows one to fabricate passive displays with more pixel densities, quarter VGA format (320×240) or higher [such as VGA4 (640×480) or XGA (1240×640)] can be achieved.

Example 4

Cavity PLEDs with High Brightness

Figure 10:
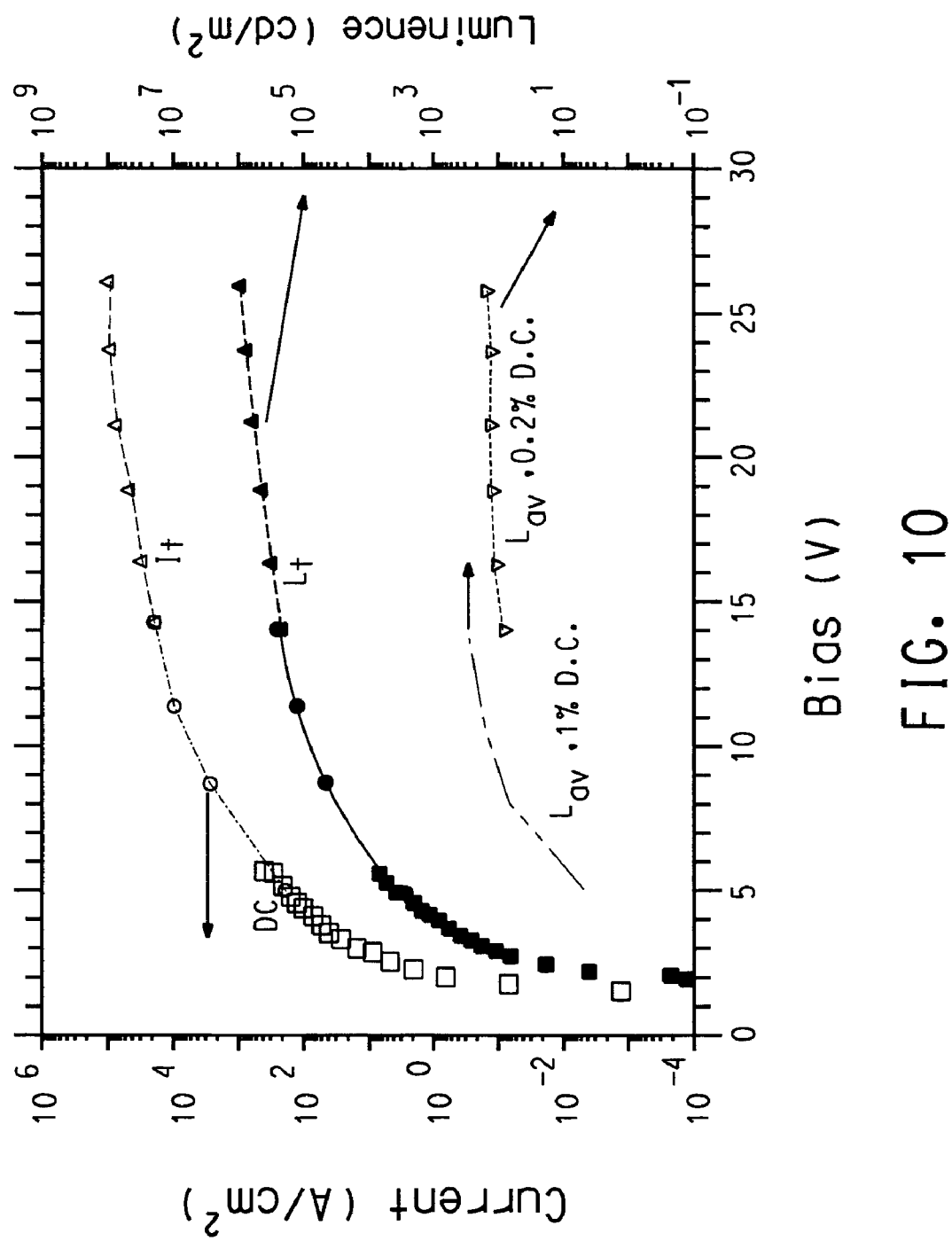
FIG. 10 illustrates transient responses of a Cr/Au microcavity device in accordance with an embodiment.

The Cr/Au devices can be driven to very high current level. A data set for a Cr/Au microcavity device operating under both DC and pulsed conditions is in FIG. 10. The data below 6V were taken under DC operation. Data taken between 5-14 V were taken under pulsed operation with duty cycle of 1%. Data between 14-26 V were taken under pulsed operation with 0.1% duty cycle. At 25 V, the transient current density is larger than 100 A/cm², and the transient luminescent intensity reaches the level of ~106 cd/m². With a more advanced polymer, luminance of ~107 cd/m² was achieved at similar operation conditions.

This result proves that the polymer LEDs can be used to fabricate high information density displays in VGA, SVGA and XGA formats. Duty cycle lower than 1/1000 can be used to operate the display panel to achieve average brightness of 100 cd/m².

Example 5

Narrowing and Tuning Blue and Yellow Polymer LEDs

Figure 11:
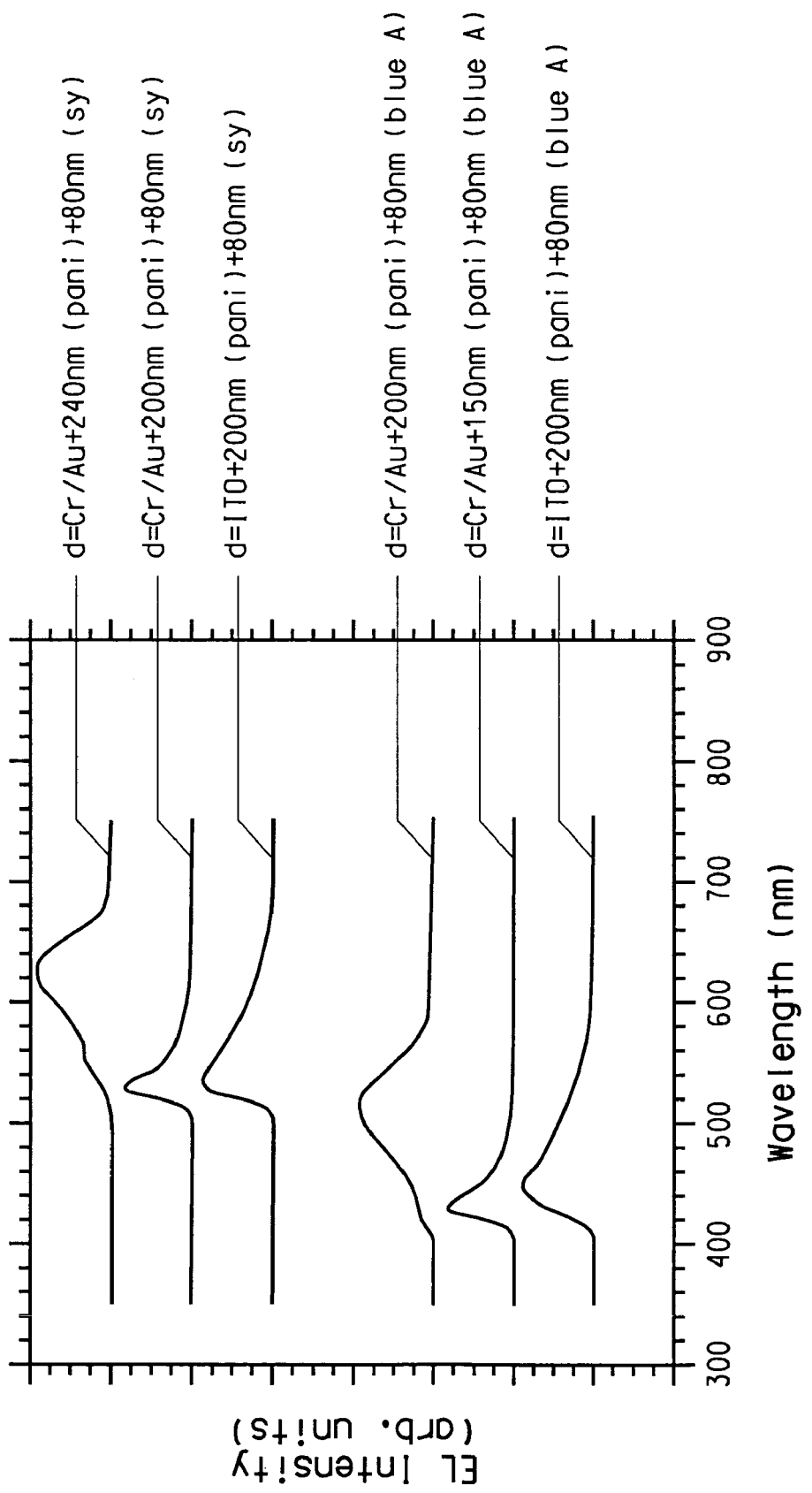
FIG. 11 illustrates EL response spectra of non-microcavity and microcavity devices in accordance with an embodiment with a single emitting polymer layer.

Microcavity devices were fabricated having the following structure: ITO/Cr/Au/PEDOT/PPV (or PF)/Ba(3 nm)/Al(300 nm). ITO coated glass was used as the substrate material. Chromium and gold were vacuum deposited on ITO coated glass or plain glass substrate as an anode material using a shadow mask. The thickness was carefully controlled for the transmission of emitting light, e.g., Cr (5 nm) and Au (15 nm) which give a transmission of about 40% at 500 nm. A conducting polymer layer such as PANI:PSS or PEDOT:PSS was coated by either spin coating or ink-jet printing. The conducting polymer layer was baked in a vacuum at 85° C. for about half an hour. Over the conducting layer, an emitting polymer layer about few hundred nanometers, e.g., a PPV (poly paraphenylenevinylene) derivative or a polyfluorene derivative was spin coated. The total thickness of the conducting and emitting polymer layers was controlled to meet the optical resonance condition provided by Eq. 2. A metal cathode of a few hundred nanometers was coated onto the device in vacuum, which cathode reflects the light over 90%. The cathode comprised a very thin low work function metal such as barium or calcium and a thick high work function metal such as aluminum. A green microcavity light emitting device was achieved with 40 nm half width (in comparison of 80 nm width in non-cavity device with the same PEDOT and EL polymer thickness). By increasing the thickness of the filling conducting layer to 240 nm and keeping the same thickness of emitting layer of 80 nm, the emitting peak moves to red at 620 nm. The blue device was achieved when 150 nm and 80 nm thickness were selected for the transparent conducting polymer and the EL polymer layers. The emission profiles are in FIG. 11.

Example 6

RGB Color PLEDS Made with a Continuous and Homogeneous White EL

Figure 12:
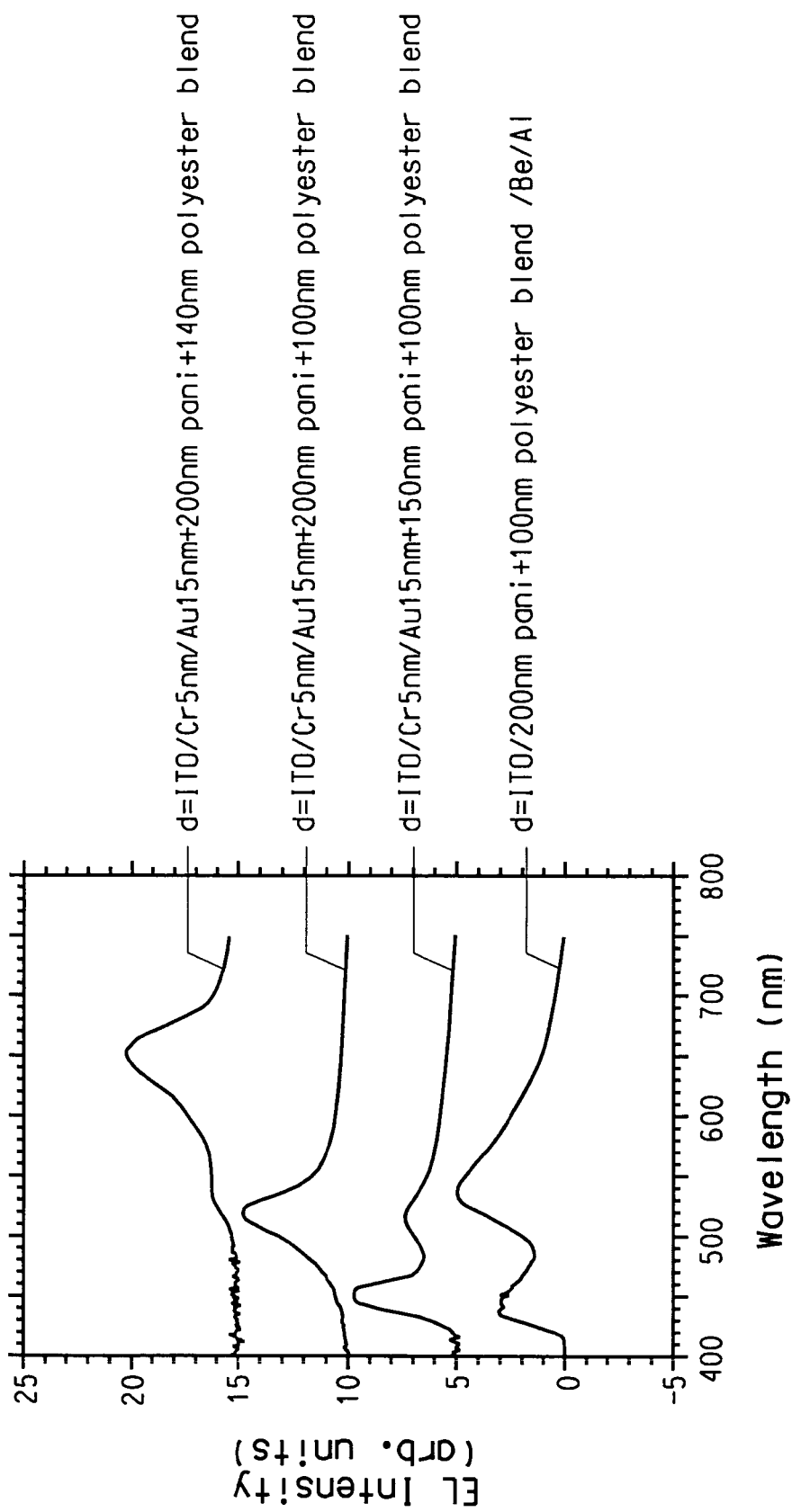
FIG. 12 illustrates EL spectra of non-microcavity and microcavity devices with a single polymer blend emitting layer in accordance with another embodiment.

Microcavity devices were fabricated in structure similarly to those in the above Example but with a polymer (or a polymer blend) with broad EL emission covering the entire visible spectral range. The conducting polymer layer was patterned with different thickness for RGB pixels by standard photolithography technique. This layer can also be coated with printing techniques (such as stamping, screen printing, ink-jet printing or thermal transfer printing) known to the experts in printing field. Over the conducting layer, a continuous, homogeneous EL polymer blend layer with white emission profile was spin-cast with thickness of about 100 nm. The optical length of the resonant cavity was adjusted by the conducting polymer layer to a thickness of conducting/emitting polymer equal to the optical resonant length of the cavity for the wavelength of red (about 650 nm), green (530 nm) and blue (about 450 nm). A metal cathode of few hundred nanometers (Ba/Al) was finally coated by thermal evaporation. Red, green and blue color pixels were achieved with this method. The emission profiles of the color pixels are shown in FIG. 12 (top three curves) and are compared with the EL emission profile of a device without microcavity (bottom curve).

This example demonstrates that the red, green and blue color PLEDs and color pixels can be made with the structure and the process discussed previously.

Example 7

RGB Color LEDs Made with a White EL Organic Molecule Layer

RGB color LEDs were made with similar device structure as that used in Example 6, but replacing the active layer with a organic molecular layer emitting white light. The order of the layers was ITO/Cr/Au/PANI/NPD/BePP$_2$/Alq$_3$/LiF/Al. A conducting polymer PANI was spin coated on Cr/Au to form the bilayer anode which provides both the electric contact and the optical spacer for the microcavity. PANI layer was baked in vacuum at 85° C. about half an hour. The conducting layer was patterned with different thickness for RGB pixels by either routine photolithography. In some of the devices, patterning with mask tapes was also used. This conductive layer can also be formed by one of the printing techniques mentioned in previous examples. Over the conducting layer, multi molecular layers, e.g., about few hundred nanometer NPD(50 nm)/BePP$_2$(5 nm)$_3$/Alq(50 nm) which emit white light were deposited by vacuum sublimation. The total optical lengths of conducting/emitting layers were arranged to meet the condition defined by Eq. 2 for the RGB pixels. The LiF/Al cathode was finally coated in vacuum. Red, green and blue color emission was observed in these devices.

This example demonstrates that color LEDs and color pixels can be made with the device structure shown in this proposal, but with organic EL molecules rather than conjugated polymers.

Example 8

Microcavity Displays Made with Other Type of Metal Anode

Microcavity devices were fabricated in structure similar to that shown in Example 1, but with a Cr/Ag layer. The Cr/Au devices with similar reflectivity were made for comparison. Conducting PANI and conducting PEDOT were used as the spacer layer. Similar device performance parameters were observed between the two metal anode.

This example demonstrates that in metal/conducting polymer bilayer electrode configuration, the conducting polymer layer determines the hole injection property of the LED. The device performance is not sensitive to the work function of the metal anode layer (the work functions of Au and Ag are 5.1 eV and 4.6 eV respectively. Metal elements and alloys commercially available can be used for the anode in these cavity devices.

Example 9

Microcavity Displays Made with Other Type of Metal Anode

Microcavity devices were fabricated in structure similar to that shown in Example 1. The thickness of the Au layer was 15 nm, while the thickness of the Cr layer was varied from 0 to 10 nm. High LED contrast (less reflection from the Cr and the back cathode layers) was observed in devices with Cr layer than that without. The thicker the Cr layer, the higher the contrast ratio. In addition to Cr, Ta and Mo were also tested for this purpose.

This example demonstrates that multiple metal layers can be introduced for microcavity PLEDs with desired reflectivity on the microcavity side and with desired low reflectivity (and thus high device contrast) on the view-front side.

Example 10

Figure 13:
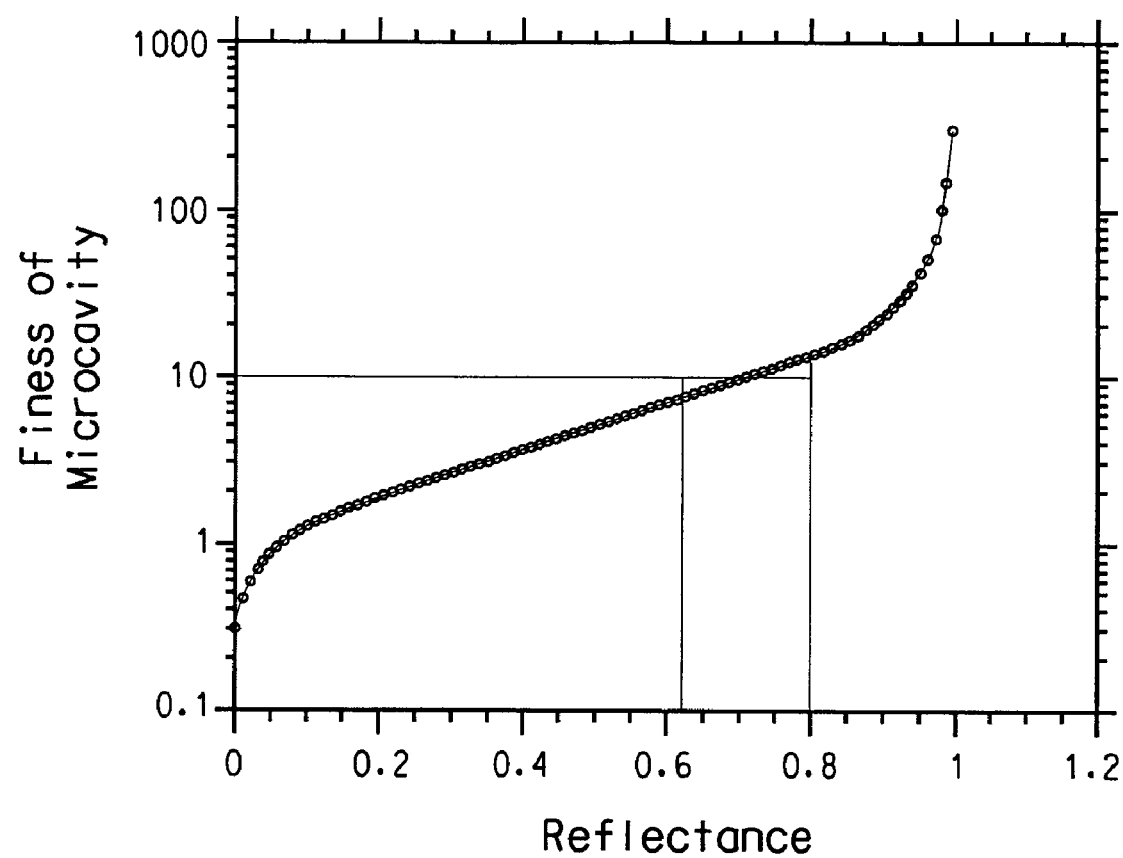
FIG. 13 illustrates a finesse as a function of reflectance of a cavity device in accordance with an embodiment.

RGB Colored Microcavity Devices with One Semiconductor Mirror and One Metal Mirror Doped semiconductor layer such as SiC, GaN, ZnO, CdSe, or CdS and so on can also serve as the anode electrode as well as the mirror for low-Q cavity poly-OLED and mol-OLEDs. The anode/mirror are semiconducting and transparent in visible range. A SiC film was p-doped and formed on an ITO substrate and the reflectivity of this film measured. The R is 50%-60% in the visible spectral range. The Finesse (Q value) of the cavity device expected was about 5; i.e., for the green pixel at 530 nm, the FMHM of the emission was expected to be about 100 nm. The relation of the Finesse and the reflectivity of the partially transparent anode is in FIG. 13.

This example demonstrates that a doped semiconductor layer can serve as both electrode contact and the optical mirror for the microcavity device.

Example 11

Devices Made in Structure of Glass/DBR/ITO/Conductive Polymer/EL Polymer/Cathode Improved EL efficiency and line-shape may be attainable with these devices since the DBR mirror has well defined reflection without optical loss (absorption). Similar device structure may be used to fabricate diodes (except without the conducting polymer buffer layer, or at least not to use it for color selection purposes). From the relation shown in FIG. 13, the reflectivity of DBR mirror will be optimized at around R=70%. This is so-called cold mirror in optical engineering field. Large volume can be made with low cost. Since the DBR used for laser cases are made with DBR mirror with high R(>>90%), we can define our boundary to DBR with approximately R<90%.

The above describes devices that have broad optoelectronic applications, especially in developing full color light emitting diodes. A new generation of full color displays may be developed based on these. An alternative approach has been provided to fabricate full-color displays with existing processes.

Note that not all of the activities described above in the general description or the examples are required, that a portion of a specific activity may not be required, and that further activities may be performed in addition to those described. Still further, the order in which each of the activities are listed are not necessarily the order in which they are performed. After reading this specification, skilled artisans will be capable of determining what activities can be used for their specific needs or desires.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense and all such modifications are intended to be included within the scope of invention.

Benefits, other advantages, and solutions to problems have been described above with regard to specific embodiments. However, the benefits, advantages, solutions to problems, and any elements that may cause any benefit, advantage, or solution to occur or become more pronounced are not to be construed as a critical, required, or essential feature or element of any or all the claims.

What is claimed is:

1. A multi-color display including a pixel array, wherein the pixel array comprises:
   (a) an organic active layer comprising an organic active material that emits a first spectral distribution of visible light having a first color;
   (b) a transparent conducting layer containing a conducting material, wherein the organic active layer and the transparent conducting layer include portions that correspond to individual pixels and sub-pixels of the array;
   (c) one or more pairs of electrodes for selectively energizing sub-pixel areas of the organic active layer to generate an emission of visible light of said first spectral distribution; and
   (d) a substrate upon which said pixel array is formed, wherein different sub-pixels within individual pixels of said array have different optical thicknesses, optical thickness comprising the conducting material and the organic active material with a distinct thickness ratio of conducting material to organic active material for each sub-pixel within the individual pixels of the array, and
   wherein at least one sub-pixel within an individual pixel of said array has a selected color different from said first color due to at least one narrowed spectral band being selected out of said first spectral distribution as said emitted light is coupled out of the display through said at least one sub-pixel including a sub-pixel portion of said transparent conducting layer having a predetermined finite optical thickness.

2. The display of claim 1, wherein the outcoupling through the sub-pixels of the transparent conducting layer comprises selecting at least one narrowed spectral band having a bandwidth that provides a finesse of approximately 10 or less.

3. The display of claim 1, wherein an injection current of 100 Amps/$cm^2$ or more provides a brightness of 106 cd/$m^2$ or more.

4. The display of claim 1, wherein the pixels comprise a quarter VGA format pixel density.

5. The display of claim 1, wherein the substrate comprises a Distributed Bragg Reflector (DBR).

6. The display of claim 5, wherein the Distributed Bragg Reflector (DBR) comprises glass or plastic having a reflectivity of less than approximately 90%.

7. The display of claim 1, wherein at least one of said pair of electrodes comprises an at least semi-transparent metallic layer including gold or silver or a combination thereof.

8. The display of claim 7, wherein said at least one of said pair of electrodes further comprises an at least semitransparent second metallic layer of chromium, tantalum or molybdenum or a combination thereof.

9. The display of claim 1, wherein the surface resistance of at least one of said pair of electrodes is approximately one ohm/$cm^2$ or less.

10. The display of claim 1, wherein at least one of said pair of electrodes comprises a compound metal bi-layer.

11. The display of claim 1, wherein the organic active layer comprises a conjugated polymer, a polymer blend, a small molecule compound, an organometallic compound, or a combinations thereof.

12. The display of claim 1, wherein said transparent conducting layer comprises a polymer.

13. A multi-color, organic LED display including a pixel array, wherein the pixel array comprises:
   (a) a substrate;
   (b) an organic active layer and a transparent conducting layer formed on the substrate:
      (i) the organic active layer comprising an organic active material that emits a first spectral distribution of visible light of a first color;
      (ii) the transparent conducting layer comprises a conductive material, the transparent conducting layer and the active layer including portions corresponding to pixels and sub-pixels of said array;
   (c) one or more pairs of electrodes for selectively energizing sub-pixel areas of the organic active layer to generate an emission of visible light of a first spectral distribution,
   wherein different sub-pixels within individual pixels of said array have different optical thicknesses, this different optical thickness resulting from distinct ratio of conducting material to orcianic active material, and wherein interface reflectivities are present wherein at least one narrowed spectral band is selected within said first spectral distribution by outcoupling emitted light through at least one corresponding sub-pixel area of said transparent conducting layer having a predetermined finite optical thickness.

14. The display of claim 13, wherein the substrate comprises a Distributed Bragg Reflector (DBR).

15. The display of claim 14, wherein the Distributed Bragg Reflector (DBR) comprises glass or plastic and having a reflectivity less than approximately 90%.

16. The display of claim 13, wherein the transparent conducting layer comprises polyaniline, polythiophene, or polypyrrole, or combinations thereof.

17. The display of claim 13, wherein the active layer comprises a substantially uniform thickness over the multiple sub-pixel areas within the pixels of the array.

18. The display of claim 17, wherein the uniform thickness is in a range approximately between 50 nm and 100 nm.

19. The display of claim 13, wherein the first spectral distribution comprises an approximately 250 nm to 300 nm width.

20. The display of claim 13, wherein the organic active layer comprises a conjugated polymer, a polymer blend, a small molecule compound, an organometallic compound, or a combinations thereof.

* * * * *